United States Patent
Lee et al.

(10) Patent No.: US 6,784,498 B1
(45) Date of Patent: Aug. 31, 2004

(54) LOW CAPACITANCE ESD PROTECTION DEVICE AND INTEGRATED CIRCUIT INCLUDING THE SAME

(75) Inventors: Jian-Hsing Lee, Pu-Tzu (TW); Yi-Hsun Wu, Shijr (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/403,976

(22) Filed: Mar. 31, 2003

(30) Foreign Application Priority Data

Nov. 7, 2002 (TW) ........................................ 91132755 A

(51) Int. Cl.[7] ............................................. H01L 23/62
(52) U.S. Cl. ............................................. 257/361
(58) Field of Search ......................... 257/355, 357, 257/360, 361

(56) References Cited

U.S. PATENT DOCUMENTS

| | | | | |
|---|---|---|---|---|
| 5,675,168 A | * | 10/1997 | Yamashita et al. | 257/355 |
| 5,714,784 A | * | 2/1998 | Ker et al. | 257/360 |
| 5,955,763 A | * | 9/1999 | Lin | 257/355 |
| 6,097,066 A | * | 8/2000 | Lee et al. | 257/355 |
| 6,259,139 B1 | * | 7/2001 | Pan | 257/355 |
| 6,420,761 B1 | * | 7/2002 | Gauthier et al. | 257/360 |
| 6,448,123 B1 | * | 9/2002 | Lee et al. | 438/200 |
| 6,611,025 B2 | * | 8/2003 | Lin | 257/355 |
| 6,621,133 B1 | * | 9/2003 | Chen et al. | 257/409 |
| 2003/0047786 A1 | * | 3/2003 | Lee et al. | 257/355 |

OTHER PUBLICATIONS

"ESD Reliability Issues in RF CMOS Circuits" Radhakrishnan, et al., IMEC Web Site, Mar. 2002, 6 pages.

* cited by examiner

Primary Examiner—Jack Chen
Assistant Examiner—Stephen W. Smoot
(74) Attorney, Agent, or Firm—Thomas, Kayden, Horstemeyer & Risley

(57) ABSTRACT

A low capacitance ESD protection device. The device comprises a substrate, a well of a first conductivity type in the substrate, a first and second transistor of the first conductivity type respectively on two sides of the well, a guard ring of a second conductivity type in the substrate, surrounding the well, and the first and second transistor, and a doped region of the second conductivity type in the well, wherein profiles of a drain and source region of each of the first and second transistor are un-symmetrical.

27 Claims, 6 Drawing Sheets

LOW CAPACITANCE ESD PROTECTION DEVICE AND INTEGRATED CIRCUIT INCLUDING THE SAME

BACKGROUND OF THE INVENTION

1. Field of the Invention

The present invention relates to an ESD protection device, and particularly to a low capacitance ESD protection device and a manufacturing method thereof applicable to RF circuits.

2. Description of the Prior Art

In recent years, extensive research has been carried out on the possibility of using pure CMOS, rather than bipolar or BiCMOS technologies, for RF applications. It is forecasted that by 2003, a large number of applications will use CMOS technology for RF system-on-chip, such as remote control, radio modems, home system automation, etc. For example, in the home system automation, the concept is to replace the data cable between appliances by wireless link centered at 2.4 GHz, with a range of approximately 8 m. The reliability of the components used in these applications is therefore obviously very important.

One of the major bottlenecks for the transition from bipolar/BiCMOS to pure CMOS is the immunity of the circuits against Electro-Static Discharge (ESD). The detrimental effects of ESD in sub-micron devices have been widely known and reported. Further, the use of pure CMOS imposes a greater demand for adequate protection circuitry against ESD, due to the greater sensitivity of CMOS for electrical overstress in general and ESD in particular. RF circuits typically require a high performance and have tight design specifications. The conventional approach to achieve higher device ESD robustness is to incorporate on-chip ESD protection networks, as well as, in many cases external protection elements. As shown in FIG. 1, the standard approach to on-chip ESD protection involves incorporating protection at inputs, outputs, which consist of elements such as diodes, nMOSFETs, etc., provide a known current path to the ESD pulse away from the core circuitry. In the classical sub-micron CMOS technology devices, this common approach could yield enough ESD robustness if the protection circuits are implemented properly.

FIGS. 1~3 are diagrams respectively showing three conventional ESD protection devices for CMOS, which are disclosed in "ESD Reliability Issues in RF CMOS Circuits", M. K. Radhakrishnam, V. Vassilev, B. Keppens, V. De Heyn, M. Natarajan, and G. Groeseneken.

FIG. 1 shows a cross-section of a ggnMOS (gate grounded nMOS) used for ESD protection. It includes a p substrate 11, isolation layer 12, n source and drain regions 131 and 132, p doped region 14, and a gate 15. The p doped region 14 couples the p substrate 11 to a cathode. The source region 131 and gate 14 are also coupled to the cathode. The drain region 132 is coupled to an anode.

FIG. 2 show a cross-section of an oxide-isolated diode used for ESD protection. It includes a p substrate 21, oxide layer 22, a n or p well 23, n doped region 241 and p doped region 242 in the well 23, and poly-silicon layer 25. The p doped region 242 and n doped region 241 are respectively the cathode and anode of the diode.

FIG. 3 shows a cross-section of a LVTSCR (low voltage triggered silicon controlled rectifier) used for ESD protection. It includes a p substrate 31, isolation layer 32, a transistor formed by an n source region 331, n drain region 332 and gate 34, p doped region 35, a n well 36, and n doped region 371 and p doped region 372 in the n well 36. The gate 34, source region 331 and p doped region 35 are coupled to the cathode while the n doped region 371 and n doped region 372 are coupled to the anode.

The previously described ESD protection devices provide ESD path between their cathode and anode. The cathode and anode may be coupled to power lines or I/O pads.

However, for RF applications, the parasitic capacitance and the series resistance of the ESD protection structure directly impacts the RF performance. For example, an unaccounted parasitic capacitance of 1 pF from an ESD protection network or device at 2.4 GHz corresponds to a load of 66 Ohms. It is important to note that the typical input pin capacitance specification for a Low Noise Amplifier used in the 1–5 GHz is less than 100 fF.

Obviously, it degrades the performance of the RF circuits if the conventional ESD protection devices for pure CMOS are applied.

SUMMARY OF THE INVENTION

The object of the present invention is to provide a low capacitance ESD protection device and a manufacturing method thereof applicable to RF circuits.

The present invention provides a low capacitance ESD protection device. The device comprises a substrate, a well of a first conductivity type in the substrate, a first and second transistor of the first conductivity type respectively on two sides of the well, a guard ring of a second conductivity type in the substrate, surrounding the well, and the first and second transistor, and a doped region of the second conductivity type in the well, wherein profiles of a drain and source region of each of the first and second transistor are un-symmetrical.

The present invention further provides a method for manufacturing a low capacitance ESD protection device. The method comprises the steps of providing a substrate, forming a well of a first conductivity type in the substrate, forming a first and second transistor of the first conductivity type respectively on two sides of the well, wherein profiles of a drain and source region of each of the first and second transistor are un-symmetrical, forming a guard ring of a second conductivity type in the substrate, surrounding the well, and the first and second transistor, and forming a doped region of the second conductivity type in the well.

The present invention provides another low capacitance ESD protection device. The device comprises a substrate, a well of a first conductivity type in the substrate, a first and second transistor of the first conductivity type respectively on two sides of the well, a guard ring of a second conductivity type in the substrate, surrounding the well, and the first and second transistor, and a doped region of the second conductivity type in the well, wherein, for each of the first and second transistor, a width of a drain region is substantially equal to that of a source region and a length of the drain region is shorter than that of the source region.

The present invention also provides an integrated circuit comprising a core circuit, and a low capacitance ESD protection device protecting the core circuit from ESD damages. The low capacitance ESD protection device comprises a substrate, a well of a first conductivity type in the substrate, a first and second transistor of the first conductivity type respectively on two sides of the well, a guard ring of a second conductivity type in the substrate, surrounding the well, and the first and second transistor, and a doped region of the second conductivity type in the well, wherein profiles of a drain and source region of each of the first and second transistor are un-symmetrical.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
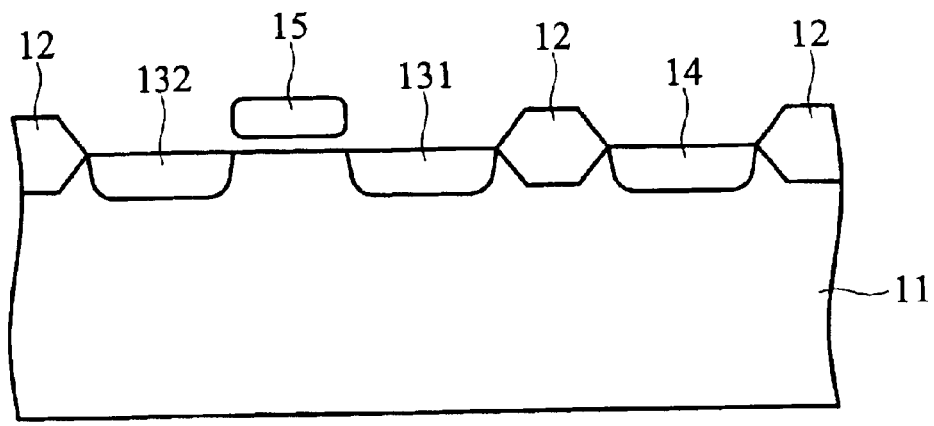
FIG. 1 shows a cross-section of a ggnMOS (gate grounded nMOS) used for ESD protection.
Figure 2:
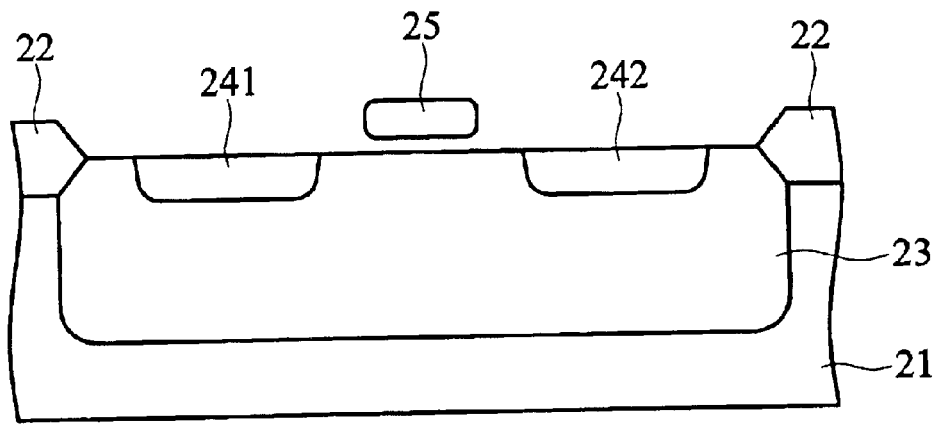
FIG. 2 show a cross-section of an oxide-isolated diode used for ESD protection.
Figure 3:
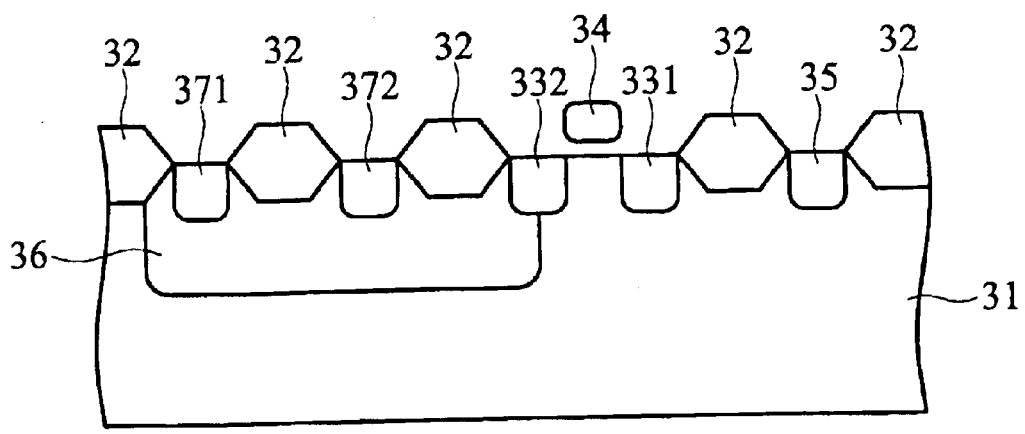
FIG. 3 shows a cross-section of a LVTSCR (low voltage triggered silicon controlled rectifier) used for ESD protection.
Figure 4:
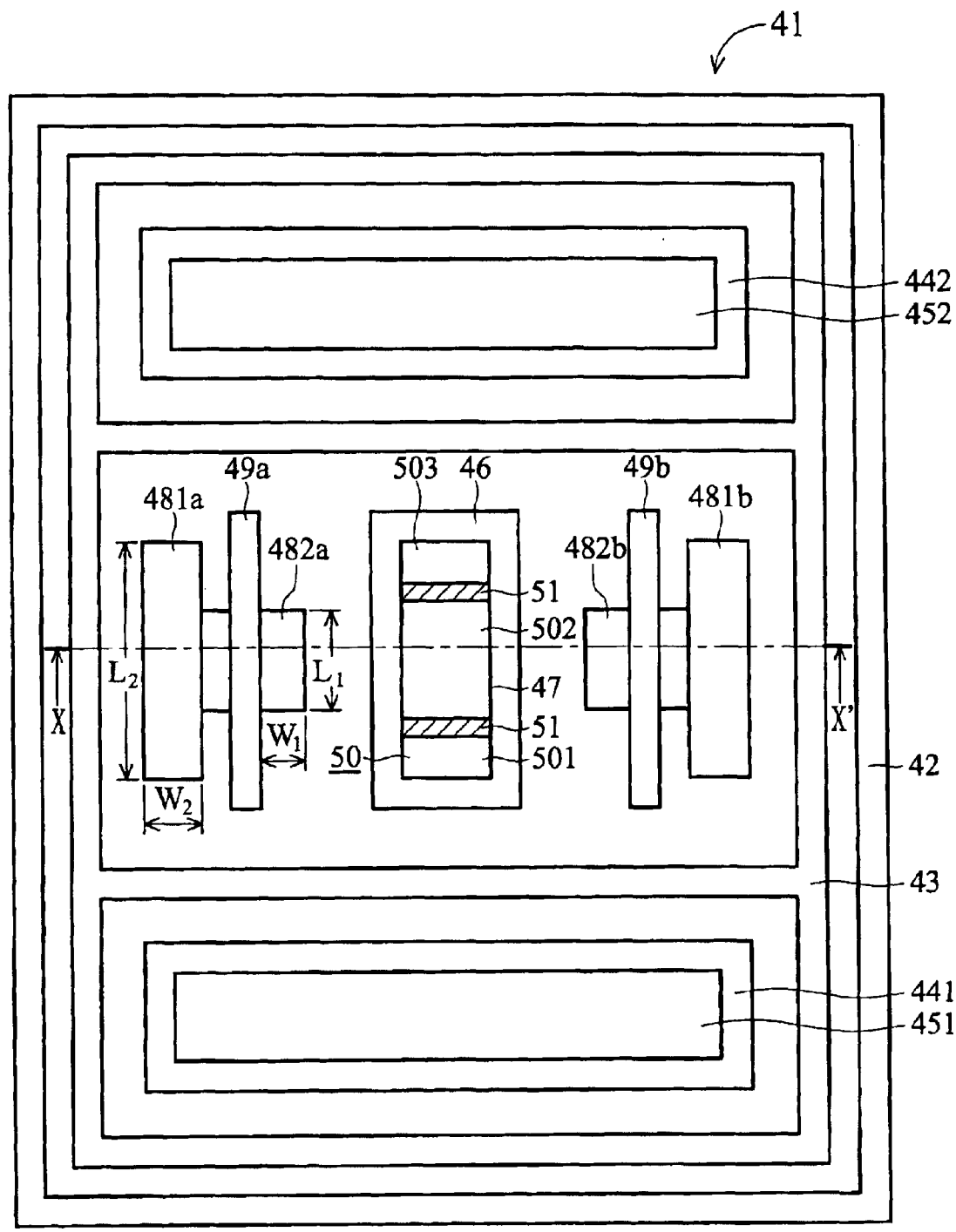
FIG. 4 is a top view of a low capacitance ESD protection device according to one embodiment of the invention.

FIG. 4 is a top view of a low capacitance ESD protection device according to one embodiment of the invention. The low capacitance ESD protection device is formed on a p silicon substrate 41 and includes an n guard ring 42, p guard ring 43, n wells 441, 442 and 46, n+ doped region 451 and 452, p+ doped region 47, n source and drain regions 481a, 481b, 482a and 482b, gates 49a and 49b, and silicide layer 50 on the p+ doped region 47. The source and drain regions 481a, 481b, 482a and 482b, and gates 49a and 49b form two transistors respectively on two sides of the n well 46. The two transistors, and n wells 441 and 442 are surrounded by the p guard ring 43. The n guard ring 42 encloses the p guard ring 42.

It is noted that, in each of the two transistors beside the n well 46, the profile of the drain region 482a or 482b is unsymmetrical to that of the source region 481a or 481b. The area of the drain region 482a or 482b is smaller than that of the source region 481a or 481b, wherein the width W1 of the drain region is substantially equal to the width W2 of the source region while the length L1 of the drain region is shorter than the length L2 of the source region. Moreover, there are gaps 51 in the silicide layer 50 so that the silicide layer 50 has three separated portions 501, 502 and 503. The portions 501 and 503 of the silicide layer 50 are coupled to the drain regions 482a and 482b respectively, and the portion 502 is coupled to a pad (not shown).

Figure 5:
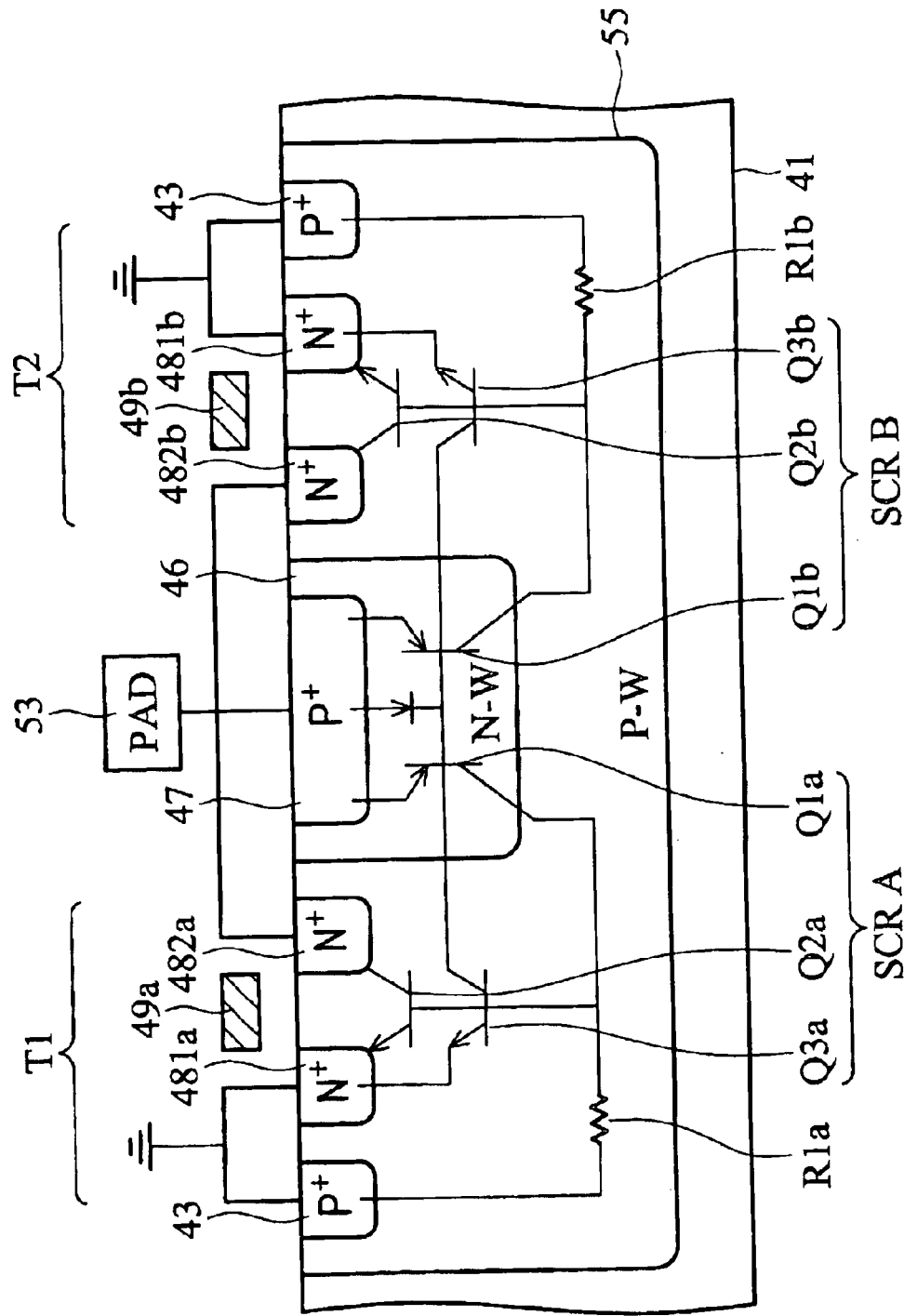
FIG. 5 is a cross-section of the low capacitance ESD protection device shown in FIG. 4.

FIG. 5 is a cross-section of the low capacitance ESD protection device shown in FIG. 4 cut along the line XX'. An I/O pad 53 receives an ESD pulse and couples it into protection device on the p substrate 41. First and a second NMOS transistors T1, T2, respectively, are symmetrically arranged around the n well 46 such that the first and second n drain regions 482a, 482b, respectively, face the n well 46 but are separated from each other. The n well 46 is quite small having a junction capacitance of less than (0.035) pF. The n well 46 has a preferred length of 4.32 $\mu$m and width of 34 $\mu$m, but the length may range from 0.5 $\mu$m to 20 $\mu$m, and the width may range from 1 $\mu$m to 100 $\mu$m. The n drain regions 482a and 482b each have a preferred width of 30 $\mu$m but the width may range from 1 $\mu$m to 100 $\mu$m. The lengths of the n drain regions 482a and 482b may range from 0.1 $\mu$m to 100 $\mu$m but must be shorter than those of the n source regions 481a and 481b.

The NMOS transistor T1 comprises the gate 49a, and n source and drain regions 481a and 482a. The NMOS transistor T2 comprises the gate 49b and n source and drain regions 481a and 482b. The p guard ring 43 is disposed in close proximity to the n source regions 481a and 481b, and surrounds the n well 46, and transistors T1 and T2. The p+ doped region 47 is disposed in the n well 46 and together form a diode. N drain regions 482a and 482b, and p+ doped region 47 are coupled to the I/O pad 53. N source regions 481a and 481b, and p guard ring 43 are coupled to receive a power supply voltage Vss.

The p doped region 47, n well 46 and p well 55/p substrate 41 form part of a parasitic silicon controlled rectifier (SCR) structure. For the sake of clarity, this SCR can be thought of consisting of two identical SCRs A and B, and will subsequently be described in this manner. The function of the SCR A is to provide a first current path for the ESD voltage from the I/O pad 53 to the source region 481a of the NMOS transistor T1, and similarly, the SCR B provides a second current path for the ESD voltage from the I/O pad 53 to the source region 481b of the NMOS transistor T2. By splitting the current path, the current handling capacity of the protection device is doubled.

The parasitic SCR A is connected between the p doped region 47 and the source region 481a, and includes a parasitic pnp transistor Q1a, parasitic npn transistor Q2a and Q3a, and bulk resistor R1a. The parasitic pnp transistor Q1a has an emitter, a base, and a collector, where the emitter is the p doped region 47, the base is the n well 46, and the collector is the p well 55. The parasitic npn transistor Q2a has an emitter, a base, and a collector, where the emitter and the collector are the source and drain of the NMOS transistor T1, respectively, and the base is the p well 55. The parasitic npn transistor Q3a has an emitter, a base, and a collector, where the emitter is the source of the NMOS transistor T1, the collector is the n well 46, and the base is the p well 55. The bulk resistor R1a is connected between the n well 46 and the p guard ring 43.

Similarly, the parasitic SCR B is connected between the p doped region 47 and the source region 481b, and includes a parasitic pnp transistor Q1b, parasitic npn transistor Q2b and Q3b, and bulk resistor R1b. The parasitic pnp transistor Q1b is connected just like transistor Q1a. The parasitic npn transistor Q2b has an emitter, a base, and a collector, where the emitter and the collector are the source and the drain of the NMOS transistor T2, respectively, and the base is the p well 55. The parasitic npn transistor Q3b has an emitter, a base, and a collector, wherein the emitter is the source of the NMOS transistor T2, the collector is the n well 46, and the base is the p well 55. The bulk resistor R1b is connected between the n well 46 and the p guard ring 43.

When an ESD event occurs the following events happen: a breakdown in the NMOS transistors occurs because the maximum electric field $E_M$ is exceeded and the electrons in the channel become "hot electrons", as a result hole currents (electron-hole pairs) are generated in the p well 55. The hole current causes the npn parasitic transistors Q2a and Q2b to turn on. The electrons of the electron-hole pairs are injected into the n well 46, and are collected by the p doped region 47, which generates a potential from the p doped region 47 to the n well 46, forward biasing the diode and turning on the parasitic pnp transistors Q1a and Q1b. The SCRs A and B turn on and the ESD current flows from the I/O pad 53 to ground or Vss.

It is noted that the drains of the transistors T1 and T2 are intentionally shrunk for reduction of the parasitic capacitance of the ESD protection device, which also reduces the maximum current flowing through the drain regions. Consequently, there are gaps in the silicide layer to increase the resistance between the I/O pad and drains for limitation of the magnitude of the ESD current.

FIGS. 6A~6D are diagrams showing a method of manufacturing a low capacitance ESD protection device according to one embodiment of the invention.

Figure 6A:
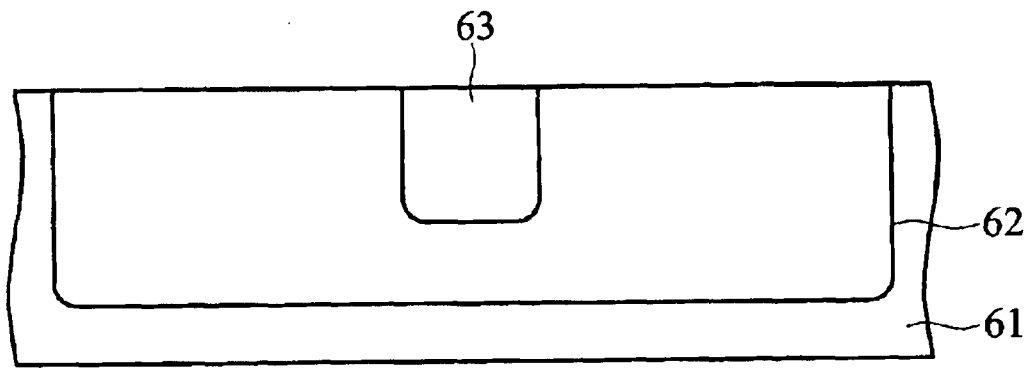
FIGS. 6A~6D are diagrams showing a method of manufacturing a low capacitance ESD protection device according to one embodiment of the invention.

As shown in FIG. 6A, a p silicon substrate 61 is provided. By ion implantation steps, a p well 62 is formed in the p substrate 61 and a n well 63 is formed in the p well 62.

Figure 6B:
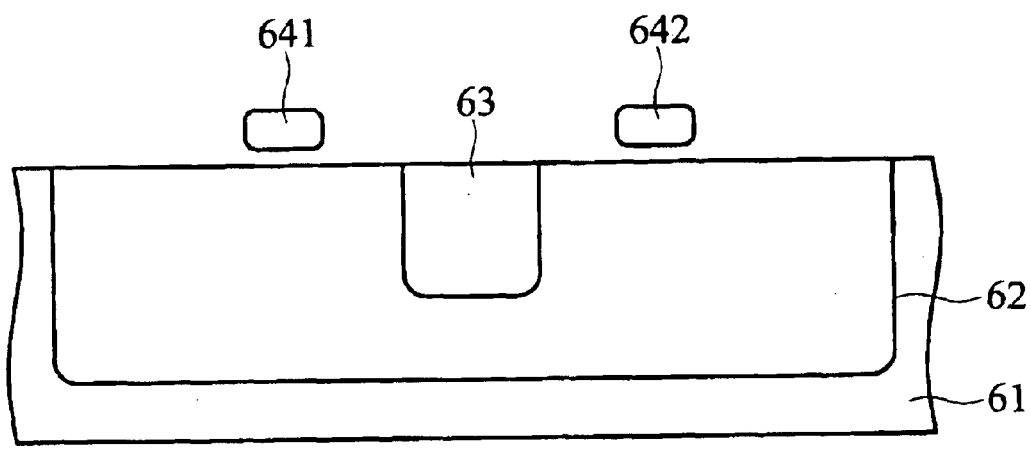

As shown in FIG. 6B, gates 641 and 642 are formed on the p substrate 61 and two sides of the n well 63. The gates 641 and 642 are made of gate oxide and poly-silicon layers.

Figure 6C:
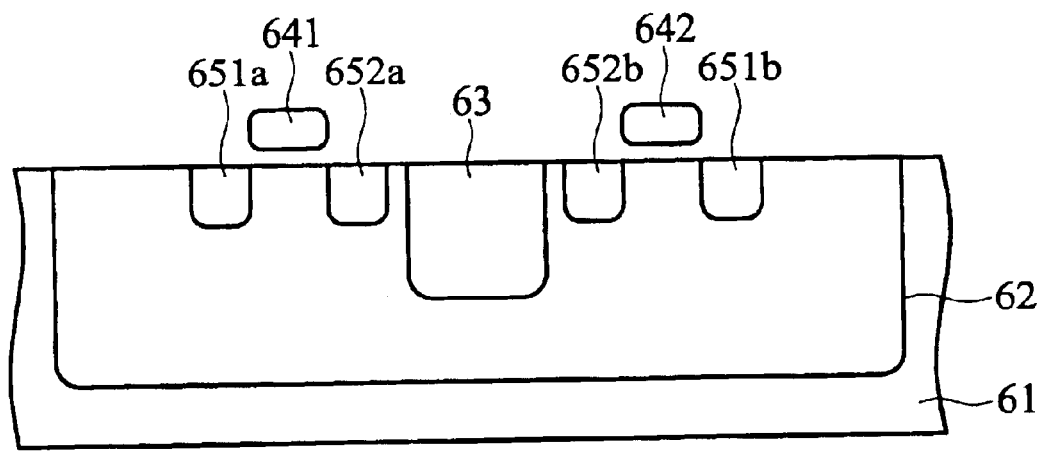

As shown in FIG. 6C, by ion implantation steps, n source and drain regions 651a, 651b, 652a and 652b are formed on two sides of the gates 641 and 642, which symmetrically forms two transistors on two sides of the n well 63. The profiles of the drain and source region of each of the transistors are un-symmetrical, wherein the length of the source regions 481a and 481b is longer than that of the drain regions 482a and 482b, as shown in FIG. 4.

Figure 6D:
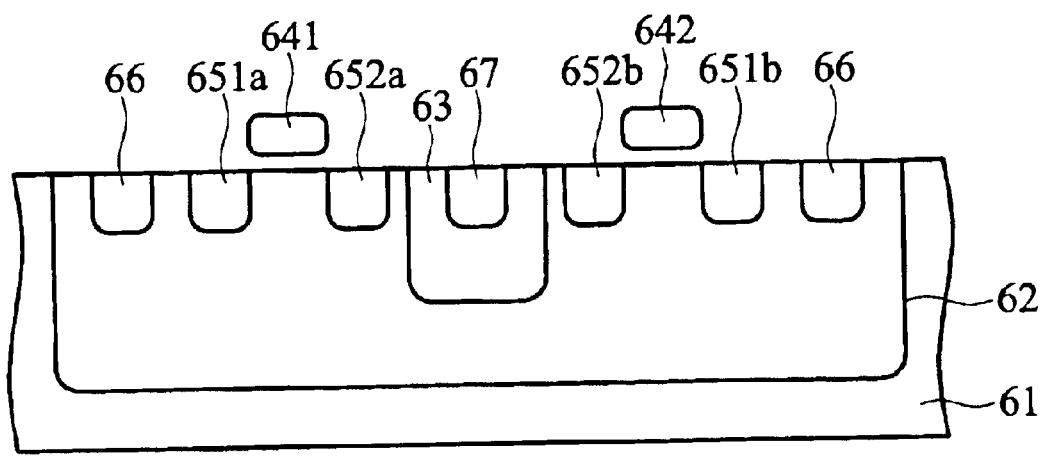

As shown in FIG. 6D, by ion implantation steps, a p guard ring 66 surrounding the well 63 and the two transistors is formed in the p substrate 61, and a p+ doped region 67 is formed in the n well 63.

Finally, contacting layers are formed on the p guard ring 66, n source and drain regions 651a, 651b, 652a and 652b, and p+ doped region 67. The conducting layers couples the p guard ring 66, and source regions 651a and 651b to ground or Vss, and couples the drain regions 652a and 652b, and p+ doped region 67 to the I/O pad. The conducting layer on the p+ doped region 67 is the silicide layer 50 (as shown in FIG. 4). The silicide layer 50 has three portions 501, 502 and 503 separated by the gaps 51. The portions 501 and 503 are coupled to the drains 652a and 652b while the portion 502 is coupled to the I/O pad.

Figure 7:
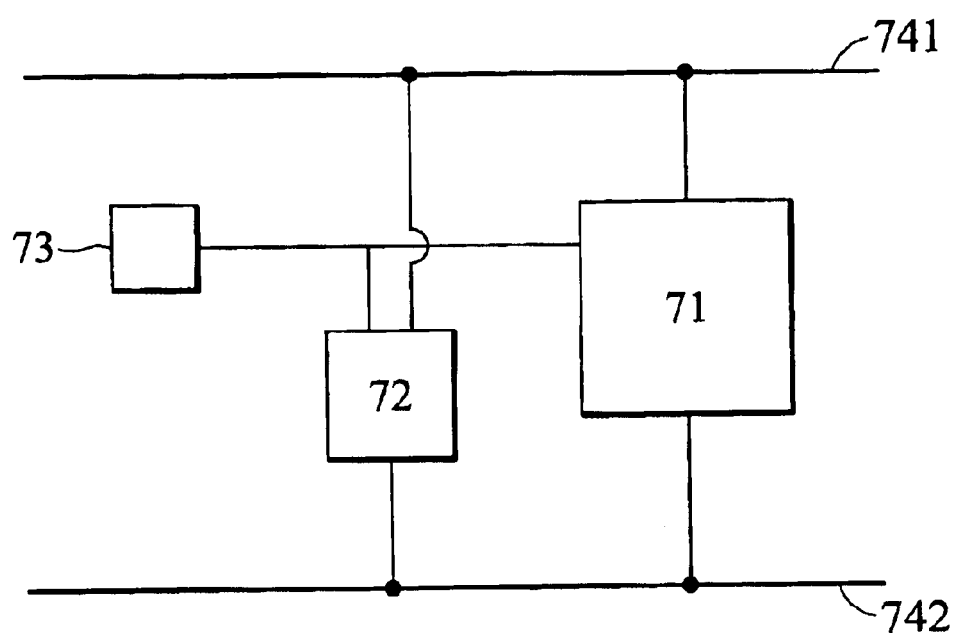
FIG. 7 is a diagram showing an integrated circuit according to one embodiment of the invention.

FIG. 7 is a diagram showing an integrated circuit according to one embodiment of the invention. The integrated circuit includes a core circuit 71 and an ESD protection device 72 protecting the core circuit 71 from ESD damages. The ESD protection device is the silicon controlled rectifier shown in FIG. 4 or 5. It provides ESD paths for the core circuit 71 when the ESD pulse zaps the I/O pad 73, or power lines 741 and 742.

In conclusion, the present invention provides a low capacitance ESD protection device. The drain and source beside the gate of the SCR is unsymmetrical, wherein the drain region is made smaller than the source region, and there are gaps in the silicide layer so that the parasitic capacitance of the SCR is reduced and the drain current is limited by the high resistance provided by the gaps to avoid burnout of the shrunk drain regions. Thus-formed ESD protection device is perfectly applicable to the RF circuits.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A low capacitance ESD protection device comprising:
   a substrate;
   a well of a first conductivity type in the substrate;
   a first and second transistor of the first conductivity type respectively on two sides of the well;
   a guard ring of a second conductivity type in the substrate, surrounding the well, and the first and second transistor; and
   a doped region of the second conductivity type in the well;
   wherein profiles of a drain and source region of each of the first and second transistor are un-symmetrical, and an area of the drain region is smaller than that of the source region in each of the first and second transistor.

2. The ESD protection device as claimed in claim 1 further comprising a second guard ring of the first conductivity type in the substrate, surrounding the guard ring of the second conductivity type.

3. The ESD protection device as claimed in claim 2, wherein the second guard ring is coupled to receive a first voltage level.

4. The ESD protection device as claimed in claim 3, wherein the first voltage level is a power supply voltage Vcc.

5. The ESD protection device as claimed in claim 1 further comprising a conducting layer on the doped region, having a first, second and third portion separated from each other by gaps, and respectively coupled to a pad, the drain region of the first transistor and the drain region of the second transistor.

6. The ESD protection device as claimed in claim 5, wherein the conducting layer is a silicide layer.

7. The ESD protection device as claimed in claim 1, wherein the doped region, and the drain regions of the first and second transistor are coupled to a pad, and the guard ring, and the source regions of the first and second transistor are coupled to receive a second voltage level.

8. The ESD protection device as claimed in claim 7, wherein the second voltage level is a power supply voltage Vss.

9. The ESD protection device as claimed in claim 1, wherein the first and second conductivity type are N and P type respectively.

10. A low capacitance ESD protection device comprising:
    a substrate;
    a well of a first conductivity type in the substrate;
    a first and second transistor of the first conductivity type respectively on two sides of the well;
    a guard ring of a second conductivity type in the substrate, surrounding the well, and the first and second transistor; and
    a doped region of the second conductivity type in the well;
    wherein, for each of the first and second transistor, a width of a drain region is substantially equal to that of a source region and a length of the drain region is shorter than that of the source region.

11. The ESD protection device as claimed in claim 10 further comprising a second guard ring of the first conductivity type in the substrate, surrounding the guard ring of the second conductivity type.

12. The ESD protection device as claimed in claim 11, wherein the second guard ring is coupled to receive a first voltage level.

13. The ESD protection device as claimed in claim 12, wherein the first voltage level is a power supply voltage Vcc.

14. The ESD protection device as claimed in claim 10 further comprising a conducting layer on the doped region, having a first, second and third portion separated from each other by gaps, and respectively coupled to a pad, the drain region of the first transistor and the drain region of the second transistor.

15. The ESD protection device as claimed in claim 14, wherein the conducting layer is a silicide layer.

16. The ESD protection device as claimed in claim 10, wherein the doped region, and the drain regions of the first and second transistor are coupled to a pad, and the guard ring, and the source regions of the first and second transistor are coupled to receive a second voltage level.

17. The ESD protection device as claimed in claim 16, wherein the second voltage level is a power supply voltage Vss.

18. The ESD protection device as claimed in claim 10, wherein the first and second conductivity type are N and P type respectively.

19. An integrated circuit comprising:
a core circuit; and
a low capacitance ESD protection device protecting the core circuit form ESD damages, comprising:
a substrate;
a well of a first conductivity type in the substrate;
a first and second transistor of the first conductivity type respectively on two sides of the well;
a guard ring of a second conductivity type in the substrate, surrounding the well; and the first and second transistor; and
a doped region of the second conductivity type in the well,
wherein profiles of a drain and source region of each of the first and second transistor are un-symmetrical, and an area of the drain region is smaller than that of the source region in each of the first and second transistor.

20. The integrated circuit as claimed in claim 19, wherein the low capacitance ESD protection device further comprises a second guard ring of the first conductivity type in the substrate, surrounding the guard ring of the second conductivity type.

21. The integrated circuit as claimed in claim 20, wherein the second guard ring is coupled to receive a first voltage level.

22. The integrated circuit as claimed in claim 21, wherein the first voltage level is a power supply voltage Vcc.

23. The integrated circuit as claimed in claim 19, wherein the low capacitance ESD protection device further comprises a conducting layer on the doped region, having a first, second and third portion separated from each other by gasps, and respectively coupled to a pad, the drain region of the first transistor and the drain region of the second transistor.

24. The integrated circuit as claimed in claim 23, wherein the conducting layer is a silicide layer.

25. The integrated circuit as claimed in claim 19, wherein the doped region, and the drain regions of the first and second transistor are coupled to a pad, and the guard ring, and the source regions of the first and second transistor are coupled to receive a second voltage level.

26. The integrated circuit as claimed in claim 25, wherein the second voltage level is a power supply voltage Vss.

27. The integrated circuit as claimed in claim 19, wherein the first and second conductivity type are N and P type respectively.

* * * * *